(12) United States Patent
Ueyama et al.

(10) Patent No.: US 6,414,244 B1
(45) Date of Patent: Jul. 2, 2002

(54) CONNECTION STRUCTURE FOR SUPERCONDUCTING CONDUCTORS INCLUDING STACKED CONDUCTORS

(75) Inventors: Munetsugu Ueyama; Kengo Ohkura; Kenichi Sato, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/941,104

(22) Filed: Aug. 28, 2001

Related U.S. Application Data (63) Continuation of application No. 08/846,170, filed on Apr. 28, 1997.

(30) Foreign Application Priority Data

May 13, 1996 (JP) .............................................. 8-117913

(51) Int. Cl.$^7$ .............................................. H01B 12/00
(52) U.S. Cl. .................... 174/125.1; 174/94 R; 29/599; 505/926; 505/237
(58) Field of Search .............................. 174/84 R, 94 R, 174/125.1; 29/599; 505/872, 925, 926, 236, 237, 704, 231, 232, 230

(56) References Cited

U.S. PATENT DOCUMENTS

| | | |
|---|---|---|
| 4,160,771 A | 7/1979 | Taylor |
| 4,277,410 A | 7/1981 | Li et al. |
| 5,330,969 A | 7/1994 | Finnemore et al. |
| 5,358,929 A | 10/1994 | Fujikami et al. |
| 5,376,755 A | 12/1994 | Negm et al. |
| 5,583,319 A | 12/1996 | Lieurance |
| 5,786,304 A | 7/1998 | Kimura et al. |
| 5,801,124 A | * 9/1998 | Gamble et al. |
| 5,861,788 A | * 1/1999 | Ohkura et al. |

FOREIGN PATENT DOCUMENTS

| | | |
|---|---|---|
| EP | 0 501 394 | 9/1992 |
| EP | 0 556 837 | 8/1993 |
| JP | 2-186575 | 7/1990 |
| JP | 4-039875 | 2/1992 |
| JP | 4-269471 | 9/1992 |
| JP | 5-234626 | 9/1993 |
| JP | 5-290947 | 11/1993 |

OTHER PUBLICATIONS

Superconductivity—Cryogenic Engineering Handbook (by Ohmsha, issued Nov. 30, 1993), pp. 913, 914.
Applied Superconductivity (by Nikkan Kogyo Shimbun Ltd., first edition, issued Jul. 15, 1986), pp. 111, 112.

* cited by examiner

Primary Examiner—Kamand Cuneo
(74) Attorney, Agent, or Firm—Foley & Lardner (57) ABSTRACT

A connection structure for superconducting conductors which can simply connect superconducting conductors with each other with small connection resistance and no sophisticated technology is provided. In a connection structure for multifilamentary superconducting conductors, superconducting wires forming the superconducting conductors respectively are joined with each other through solder.

10 Claims, 11 Drawing Sheets

CONNECTION STRUCTURE FOR SUPERCONDUCTING CONDUCTORS INCLUDING STACKED CONDUCTORS

This application is a continuation of U.S. patent application Ser. No. 08/846,170, filed Apr. 28, 1997.

BACKGROUND OF THE INVENTION

1. Field of the Invention

The present invention relates to a connection structure for superconducting conductors each prepared by assembling a plurality of superconducting wires, and more particularly, it relates to a connection structure for superconducting conductors employed in the field of power transportation, high-energy transportation, medical care or the like effectively utilizing superconductors.

2. Description of the Background Art

In order to apply superconducting conductors to a coil or the like, for example, it is necessary to connect the conductors with each other. If superconducting conductors each prepared by assembling a plurality of superconducting wires with each other are directly connected with each other by solder or the like, however, connection resistance is disadvantageously increased.

On the other hand, various studies have been generally made as to a connection structure for superconducting wires having small connection resistance.

In relation to structures of connected portions of metal superconducting wires, for example, such studies include a method of directly connecting superconducting filaments with each other for reducing connection resistance, as described in "Superconductivity Cryogenic Engineering Handbook" (by Ohmsha, issued on Nov. 30, 1993) pp. 913 to 914. According to this method, the connection resistance is extremely reduced and hence the superconducting conductors can be applied to a nuclear magnetic resonance imaging apparatus employed for medical care or the like, for example.

As a connection structure for oxide superconducting wires, on the other hand, superconductors of metal-coated superconducting wires are connected with each other as disclosed in Japanese Patent Laying-Open No. 4-269471 (1992), or superconducting filaments of superconducting multifilamentary wires are connected with each other as disclosed in Japanese Patent Laying-Open No. 5-234626 (1993). According to this method, connection resistance is suppressed to allow persistent current joining.

Further, "Applied Superconductivity" (by the Nikkan Kogyo Shimbun Ltd., the first edition issued on Jul. 15, 1986, pp. 111 to 112) discloses a method of directly connecting filaments with each other while removing matrices for reducing connection resistance if superconducting wires must be connected with each other in an intermediate stage of wiring in an MRI coil driven in a persistent current mode which must avoid magnetic field attenuation.

However, every such prior art disadvantageously requires sophisticated technology for the connection, although small resistance can be attained as described above.

In the method disclosed in Japanese Patent Laying-Open No. 5-234626 (1993), for example, coatings of the multifilamentary wires must be removed for exposing portions of the superconducting filaments to be connected with each other, while it is predicted that this operation is complicated and difficult due to extremely small diameters of the filaments. Particularly in multifilamentary superconducting wires each having a number of filaments embedded therein, it is extremely difficult to connect such filaments with each other. Further, it is particularly difficult to expose filaments of oxide superconductors, due to inferior flexibility of ceramics.

SUMMARY OF THE INVENTION

In order to solve the aforementioned problems, an object of the present invention is to provide a connection structure for superconducting conductors which can simply connect superconducting conductors with each other with small connection resistance and no requirement for sophisticated technology.

The connection structure for superconducting conductors according to the present invention is characterized in that each of first and second superconducting conductors to be connected with each other includes first and second superconducting wires, each of the first and second superconducting wires includes a filament assembly containing superconducting filaments, the first superconducting wire of the first superconducting conductor is joined with that of the second superconducting conductor, and the second superconducting wire of the first superconducting conductor is joined with that of the second superconducting conductor.

Namely, the present invention mainly relates to a connection structure for connecting two superconducting conductors, each prepared by assembling a plurality of multifilamentary superconducting wires, with each other on end portions thereof.

While first and second superconducting conductors having identical sectional structures are connected with each other in general, the present invention is adapted to join the first superconducting wire forming the first superconducting conductor with the first superconducting wire, which is in a position corresponding to the first superconducting wire of the first superconducting conductor in a section of the conductor, in the superconducting wires forming the second superconducting conductor. Similarly, the respective superconducting wires forming the first superconducting conductor are joined with the superconducting wires, which are in corresponding positions, forming the second superconducting conductor.

For example, the superconducting conductors are divided into the respective superconducting wires on the end portions thereof, so that the superconducting wires to be joined are thereafter superposed with each other in constant lengths and joined with each other.

According to the present invention having the aforementioned structure, a connection structure having smaller connection resistance is obtained as compared with the case of directly connecting superconducting conductors with each other. Further, the present invention requires no sophisticated technology for the connection as compared with the case of connecting filaments with each other, dissimilarly to the prior art.

Consequently, superconducting conductors can be simply connected with each other with small connection resistance and no requirement for sophisticated technology.

Preferably, a first joined body defined by connecting the first superconducting wires forming the first and second superconducting conductors with each other is further joined with a second joined body defined by connecting the second superconducting wires forming the first and second superconducting conductors with each other.

When the joined bodies are further joined with each other, the connection between the superconducting conductors is further fixed.

Preferably, the first joined body defined by connecting the first superconducting wires forming the first and second superconducting conductors with each other may be electrically insulated from the second joined body defined by connecting the second superconducting wires forming the first and second superconducting conductors with each other.

When the joined bodies are electrically insulated from each other, the connection resistance is further reduced.

In order to electrically insulate the joined bodies from each other, a method of inserting an insulating material such as a Teflon tape between the joined bodies is employed, for example. In this case, it is preferable to employ an insulating material having a length at least identical to those of joined portions defined by two superconducting wires which are superposed with each other, and an insulating material having a length larger than those of the joined portions may be employed.

In order to electrically insulate the joined bodies from each other, a method of winding a Teflon tape or the like on the joined portion of each joined body is also employed, in place of the method of inserting the insulating material between the joined bodies. Also in this case, it is preferable to wind an insulating material having a length at least identical to those of the joined portions, and an insulating material having a length larger than those of the joined portions may be wound.

According to the present invention, the joining between the superconducting wires and the further joining between the joined bodies are attained by electrical connection with solder, for example. The solder may be prepared from Pb—Sn, for example.

According to the present invention, the superconducting wires can be formed by metal-coated superconducting wires, for example. A material employed for such metal coating is preferably unreactive to superconductors and easy to work, and in more concrete terms, silver or gold, or an alloy such as a gold-silver alloy, a gold-manganese alloy or a silver-antimony alloy is employed.

While the present invention is applicable to both of connection between metal superconducting conductors and that between oxide superconducting conductors, the effect of the present invention is further excellently attained in case of connecting oxide superconducting conductors with each other in particular, as compared with the prior art having remarkable disadvantages in operation.

According to the present invention, a yttrium, bismuth or thallium oxide superconductor is employed as an oxide superconductor, the bismuth oxide superconductor is most preferable in view of a high critical temperature, a high current density, low toxicity and no requirement for a rare earth element.

The present invention is not restricted to dc conductors, but is also applicable to connection of ac superconducting conductors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Oxides or carbonates were mixed with each other so that Bi, Pb, Sr, Ca and Cu were in the composition ratios of 1.80:0.41:2.01:2.18:3.02, for preparing powder mainly consisting of a 2212 phase and a non-superconducting phase by heat treatment. This powder was degassed in the atmosphere at 800° C. for two hours. The degassed powder was charged in a silver pipe of 12 mm in outer diameter and 10 mm in inner diameter, and drawn to a diameter of 1.93 mm. 61 such drawn powder materials were charged in a silver pipe of 21.23 mm in outer diameter and 17.37 mm in inner diameter, which in turn was drawn to an outer diameter of 1.4 mm. The obtained wire was rolled to a thickness of 0.26 mm.

Figure 1:
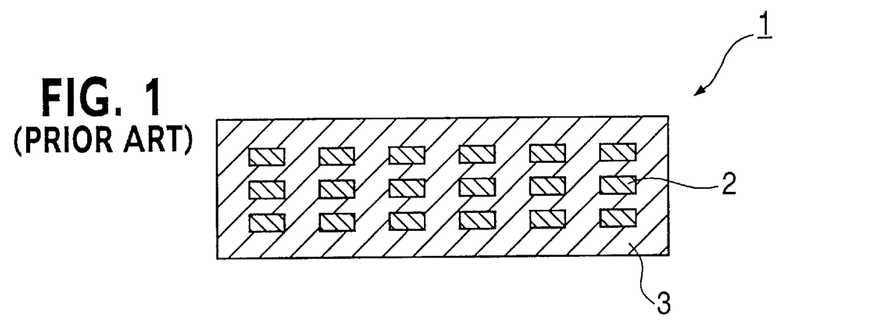
FIG. 1 illustrates a cross section of a tape-like multifilamentary superconducting wire.

FIG. 1 illustrates a cross section of a tape-like multifilamentary superconducting wire 1 prepared in the aforementioned manner.

Referring to FIG. 1, this tape-like multifilamentary superconducting wire 1 is formed by a stabilizing material 3 consisting of silver and 61 filaments 2, consisting of an oxide superconductor, embedded therein.

This tape-like multifilamentary superconducting wire 1 had a width of 3.6 mm and a thickness of 0.24 mm, and exhibited a critical current of 60 A and a critical current density of 30,000 A/cm$^2$.

Then, pairs of superconducting conductors A and B each formed by stacking three such tape-like multifilamentary superconducting wires 1 were prepared and connected with each other in the following various methods:

EXAMPLE 1

First, each of the superconducting conductors A and B was divided into the respective superconducting wires up to a portion of about 40 mm from an end thereof. Then, the superconducting wires forming the superconducting conductor A and those forming the superconducting conductor B were superposed with each other one by one by about 30 mm, and electrically connected with each other through solder consisting of Pb—Sn.

Figure 2:
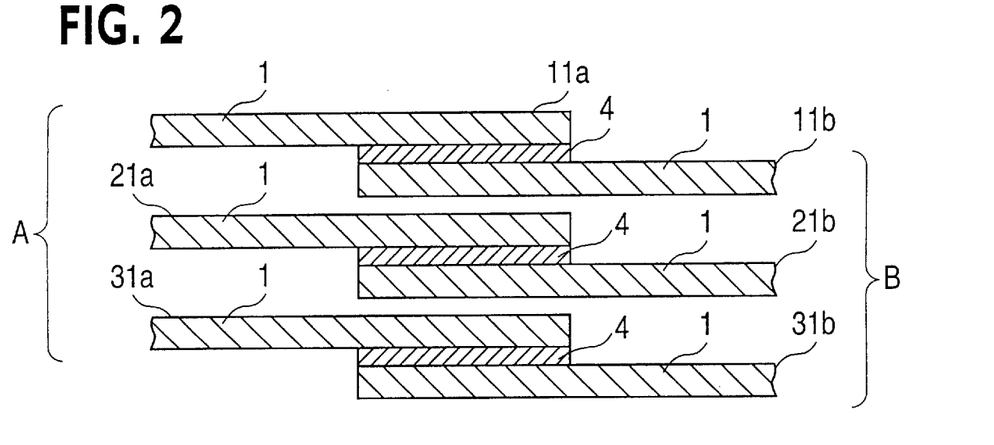
FIGS. 2 to 6 are longitudinal sectional views showing exemplary connection structures for superconducting conductors according to the present invention.

FIG. 2 is a longitudinal sectional view showing a connection structure for the superconducting conductor A formed by assembling three multifilamentary superconducting wires 11a, 21a and 31a and the superconducting conductor B formed by assembling multifilamentary superconducting wires 11b, 21b and 31b.

Referring to FIG. 2, the superconducting wires 11a and 11b of the superconducting conductors A and B respectively were joined with each other through a solder layer 4 while superposing the ends thereof with each other by about 30 mm. The solder layer 4 had a thickness of about 10 to 100 $\mu$m, and a length of about 30 mm, which was identical to those of the joined portions.

Similarly, the superconducting wires 21a and 21b and 31a and 31b of the superconducting conductors A and B respectively were joined with each other through solder layers 4 in a state superposed with each other by about 30 mm.

Then, a joined body defined by connecting the superconducting wires 11a and 11b with each other was further joined at their broad surfaces with that defined by connecting the superconducting wires 21a and 21b with each other through solder. Similarly, the joined body defined by connecting the superconducting wires 21a and 21b with each other was joined with that defined by connecting the superconducting wires 31a and 31b with each other through solder.

Figure 3:
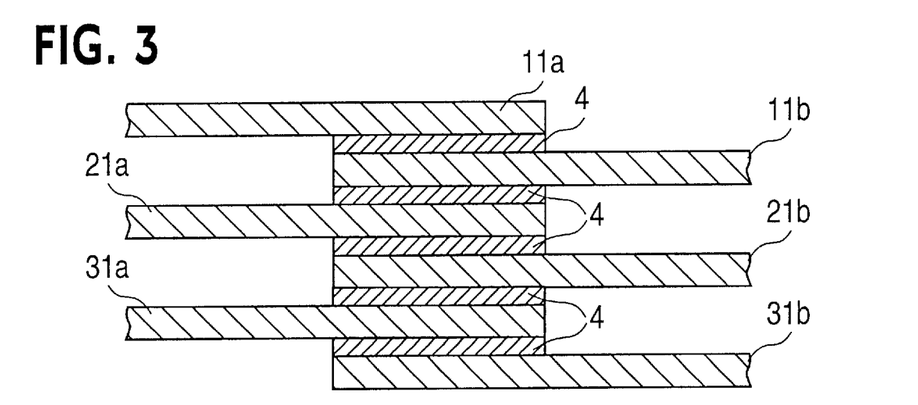

FIG. 3 is a longitudinal sectional view showing a connection structure for the superconducting conductors A and B obtained in the aforementioned manner.

Referring to FIG. 3, the joined body defined by connecting the superconducting wires 11a and 11b with each other was further joined with that defined by connecting the superconducting wires 21a and 21b with each other through a solder layer 4. Similarly, the joined body defined by connecting the superconducting wires 21a and 21b with each other was further joined with that defined by connecting the superconducting wires 31a and 31b with each other through a solder layer 4. Each of the solder layers 4 further joining these joined bodies with each other also had a thickness of about 10 to 100 $\mu$m, and a length of about 30 mm.

EXAMPLE 2

After the superconducting wires forming the superconducting conductors A and B respectively were joined with each other as shown in FIG. 2, the joined body defined by connecting the superconducting wires 11a and 11b with each other was electrically insulated from that defined by connecting the superconducting wires 21a and 21b with each other by inserting a Teflon tape therebetween. Similarly, the joined body defined by connecting the superconducting wires 21a and 21b with each other was also electrically insulated from that defined by connecting the superconducting wires 31a and 31b with each other by inserting a Teflon tape therebetween.

Figure 4:
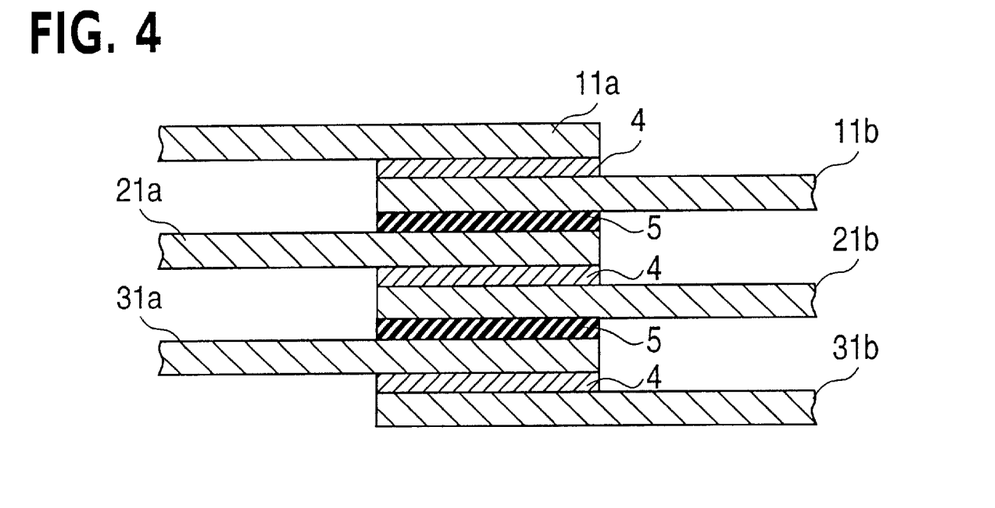

FIG. 4 is a longitudinal sectional view showing a connection structure for the superconducting conductors A and B obtained in the aforementioned manner.

Referring to FIG. 4, the joined body defined by connecting the superconducting wires 11a and 11b with each other was electrically insulated from that defined by connecting the superconducting wires 21a and 21b with each other through a Teflon tape 5. Similarly, the joined body defined by connecting the superconducting wires 21a and 21b with each other was also electrically insulated from that defined by connecting the superconducting wires 31a and 31b with each other through a Teflon tape 5. Each of these Teflon tape 5 had a thickness of about 50 $\mu$m, and a length of about 30 mm similarly to the joined portions.

Figure 5:
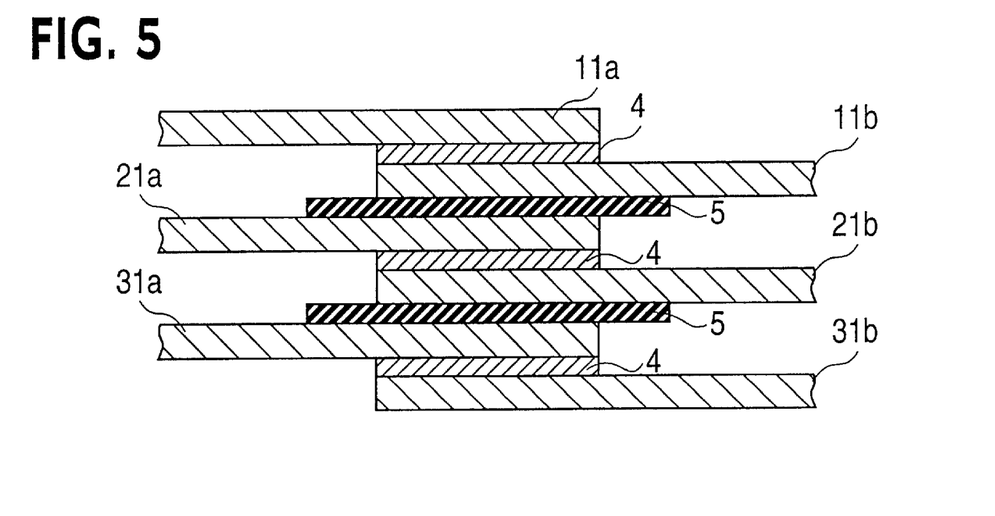

While the Teflon tapes 5 must have lengths which are at least identical to those of the joined portions in order to electrically insulate the joined bodies from each other, such Teflon tapes 5 may have lengths larger than those of the joined portions, as shown in FIG. 5.

As a method of electrically insulating joined bodies from each other through Teflon tapes, a method of winding Teflon tapes on peripheries of connected portions of the joined bodies is also conceivable, in addition to the aforementioned method of inserting the Teflon tapes between the joined bodies.

Figure 6:
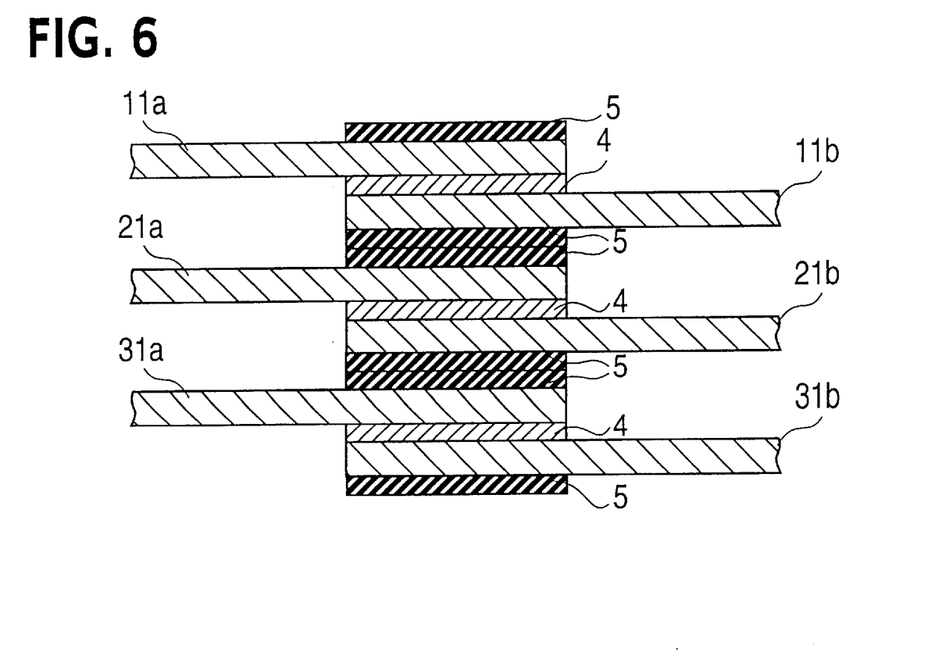
Figure 7:
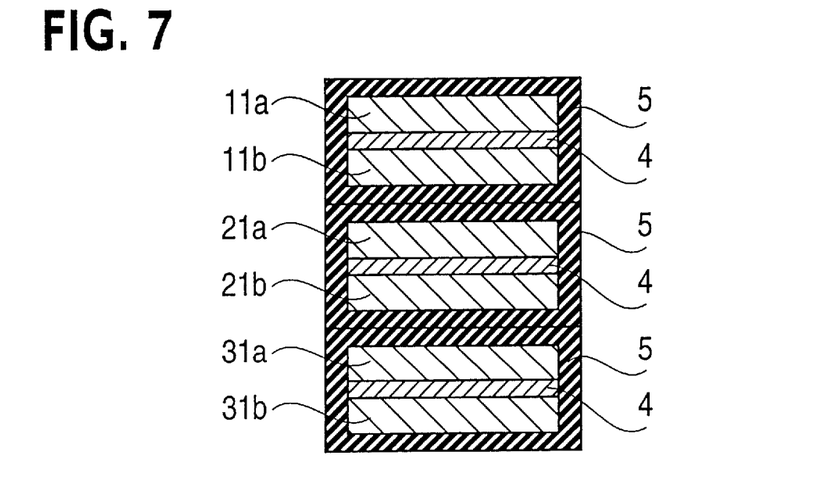
FIG. 7 is a cross sectional view showing a further exemplary connection structure for superconducting conductors according to the present invention.

FIGS. 6 and 7 are longitudinal and cross sectional views showing a connection structure for superconducting conductors in case of winding Teflon tapes respectively.

Referring to FIGS. 6 and 7, Teflon tapes 5 are wound on overall peripheries of joined bodies. According to this structure, further reduction of connection resistance can be expected.

Also in this case, the Teflon tapes 5 must be wound over lengths at least identical to those of the joined portions, or may be wound over ranges longer than the joined portions.

Comparative Example 1

For the purpose of comparison, superconducting conductors A and B were electrically connected with each other through solder consisting of Pb—Sn in a state superposed with each other by about 30 mm.

Figure 26:
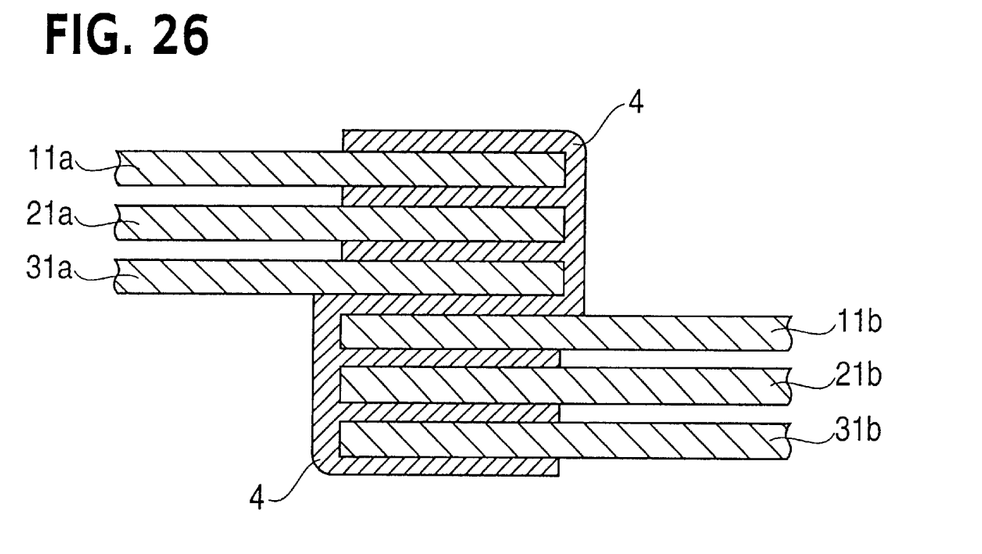
FIG. 26 is a longitudinal sectional view showing an exemplary connection structure for superconducting conductors according to comparative example.

FIG. 26 is a longitudinal sectional view showing a connection structure for the superconducting conductors A and B obtained in the aforementioned manner.

Referring to FIG. 26, the superconducting conductor A formed by assembling superconducting wires 11a, 21a and 31a was integrally joined with the superconducting conductor B formed by assembling superconducting wires 11b, 21b and 31b through a solder layer 4.

(Connection Resistance Measuring Test)

As to each of the connection structures according to Examples 1 and 2 and comparative example 1 shown in FIGS. 3, 4 and 26 respectively, three samples were subjected to measurement of connection resistance, and the obtained values were compared with each other.

The connection resistance was calculated by cooling each sample with liquid nitrogen, mounting terminals on portions of 10 mm from both ends of connection portions for feeding a dc current, and measuring a current value and a voltage value at an inter-terminal distance of about 50 mm.

Table 1 shows the results of the measurement.

TABLE 1

| Sample No. | Connection Resistance ($\mu\Omega$) |
| --- | --- |
| Example 1 | |
| 1 | 0.04 |
| 2 | 0.03 |
| 3 | 0.05 |
| Example 2 | |
| 1 | 0.01 |
| 2 | 0.007 |
| 3 | 0.008 |

TABLE 1-continued

| Sample No. | Connection Resistance ($\mu\Omega$) |
| --- | --- |
| Comparative Example 1 | |
| 1 | 0.1 |
| 2 | 0.2 |
| 3 | 0.15 |

Referring to table 1, it is understood that the connection resistance was reduced in Example 1 connecting the superconducting wires with each other as compared with comparative example 1 integrally connecting the conductors with each other.

It is also understood that the connection resistance was further reduced in Example 2 electrically insulating the joined bodies from each other.

The aforementioned disclosure in relation to Examples shows mere concrete examples of the present invention, and restricts no technical scope of the present invention at all. In other words, application of the present invention is not restricted to connection between three-layer conductors of tape-like multifilamentary superconducting wires. Exemplary application of the present invention to superconducting conductors having another structure is now described with reference to the remaining drawings.

Figure 8:
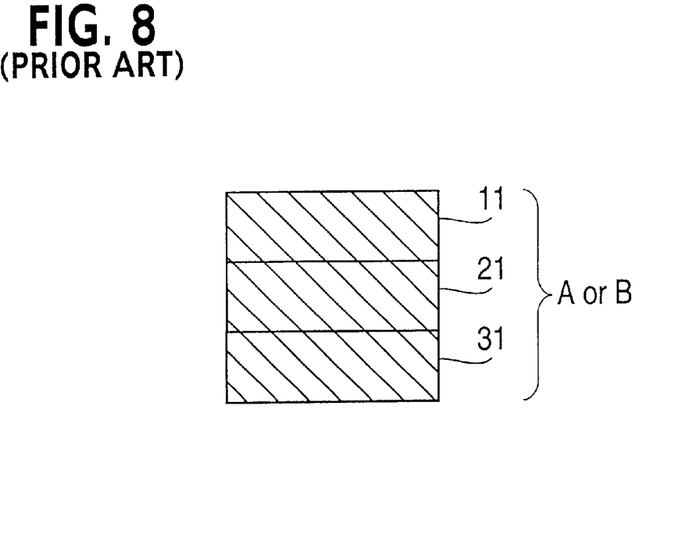
FIG. 8 is a cross sectional view showing an exemplary structure of a superconducting conductor.

FIG. 8 is a cross sectional view typically showing an exemplary structure of a superconducting conductor.

FIGS. 9 to 14 are cross sectional views typically showing connection structures for pairs of superconducting conductors A and B, each having the structure shown in FIG. 8, with each other respectively.

Figure 9:
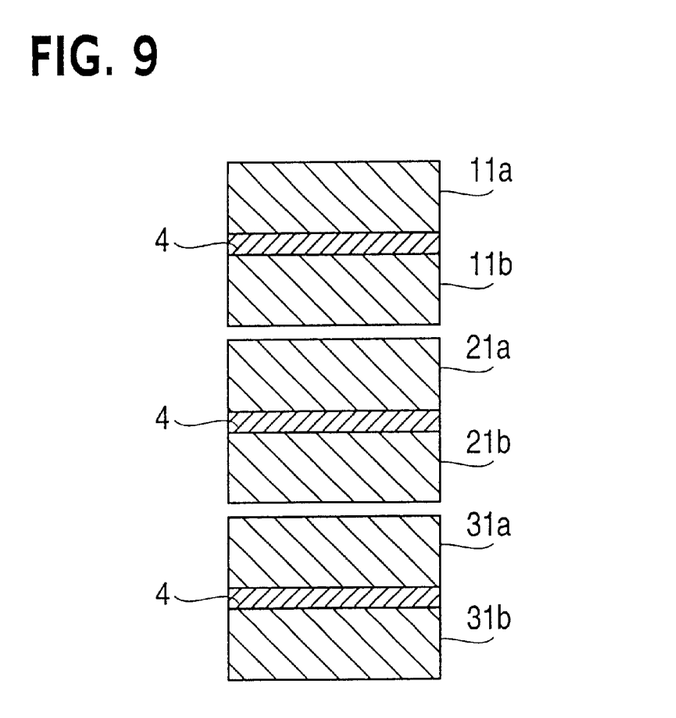
FIGS. 9 to 14 are cross sectional views showing exemplary connection structures according to the present invention for superconducting conductors each having the structure shown in FIG. 8.

In an additional method of connecting two superconducting conductors A and B each having the structure shown in FIG. 8 with each other, superconducting wires 11a and 11b of the superconducting conductors A and B are respectively connected with each other thorough a solder layer 4 so that tape surfaces are superposed with each other, while superconducting wires 21a and 21b and 31a and 31b of the superconducting conductors A and B are similarly connected through solder layers 4 as shown in FIG. 9, for example.

Figure 10:
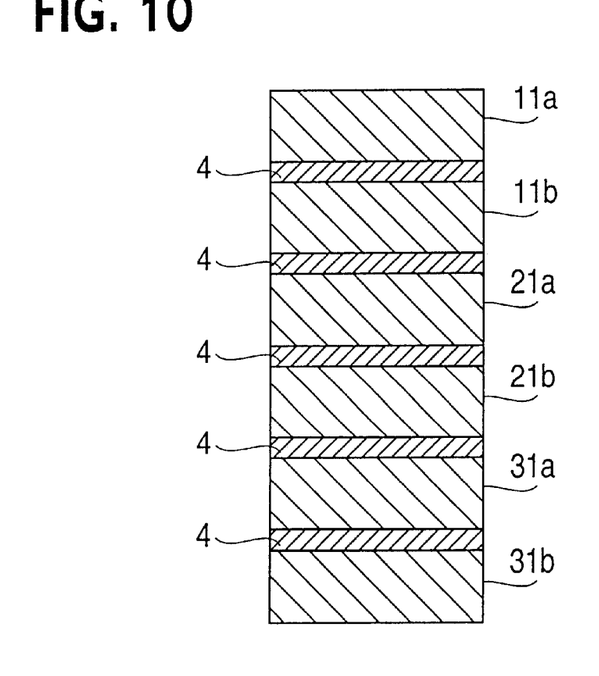

As shown in FIG. 10, a joined body defined by connecting the superconducting wires 11a and 11b with each other may be further joined with that defined by connecting the superconducting wires 21a and 21b with each other through a solder layer 4 while also joining the joined body defined by connecting the superconducting wires 21a and 21b with each other with that defined by connecting the supercon- ducting wires 31a and 31b with each other similarly through a solder layer 4.

Figure 11:
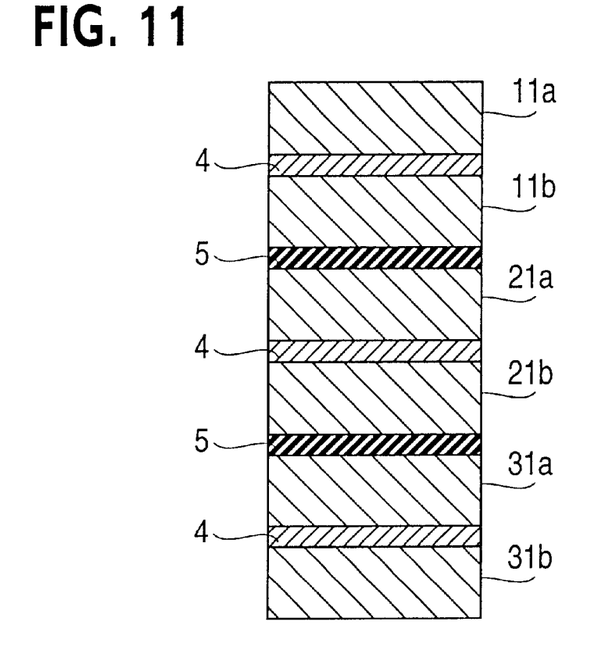

Alternatively, the joined body defined by connecting the superconducting wires 11a and 11b with each other may be electrically insulated from that defined by connecting the superconducting wires 21a and 21b with each other through an insulating tape 5 while also electrically insulating the joined body defined by connecting the superconducting wires 21a and 21b with each other from that defined by connecting the superconducting wires 31 and 31b with each other similarly through an insulating tape 5, as shown in FIG. 11.

The examples shown in FIGS. 9, 10 and 11 coincide with those shown in FIGS. 2, 3 and 4 or 5 respectively.

Figure 12:
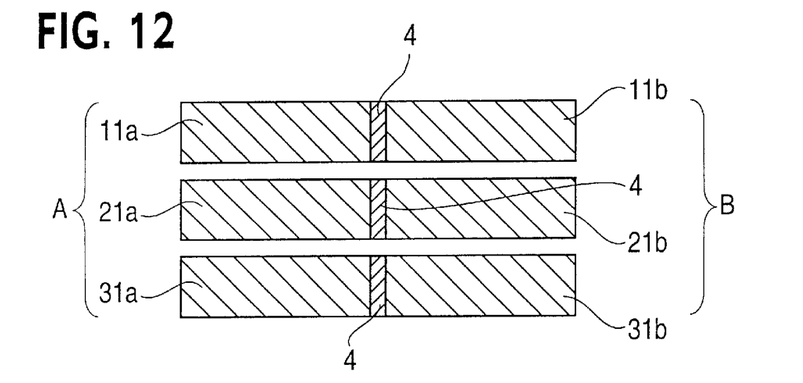

An additional method of connecting two superconducting conductors A and B each having the structure shown in FIG. 8 with each other involves a method of joining superconducting wires 11a and 11b of the superconductors A and B respectively with each other through a solder layer 4 so that side surfaces of the tape-like wires 11a and 11b are superposed with each other. This method can also include joining superconducting wires 21a and 21b and 31a and 31b of the superconducting conductors A and B respectively, with each other similarly through solder layers 4 as shown in FIG. 12, for example.

Figure 13:
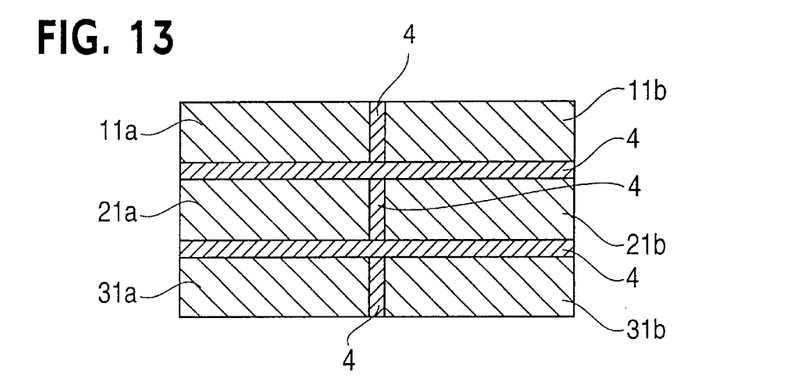

Further, the joined body defined by connecting the superconducting wires 11a and 11b with each other may be further joined with that defined by connecting the superconducting wires 21a and 21b with each other through a solder layer 4 while also joining the joined body defined by connecting the superconducting wires 21a and 21b with each other with that defined by connecting the superconducting wires 31a and 31b with each other similarly through a solder layer 4, as shown in FIG. 13.

Figure 14:
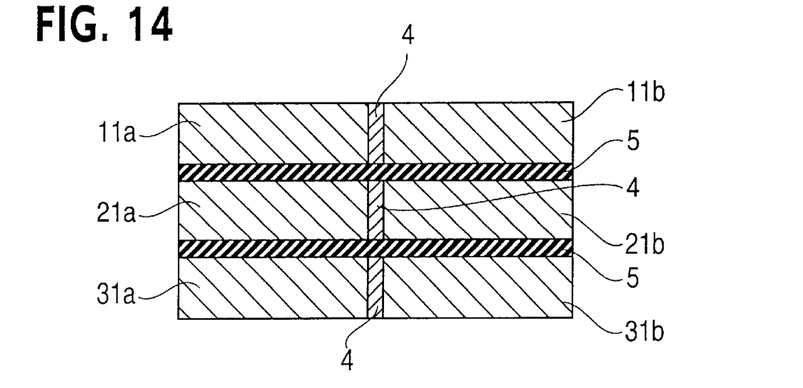

Alternatively, the joined body defined by connecting the superconducting wires 11a and 11b with each other may be electrically insulated from that defined by connecting the superconducting wires 21a and 21b with each other through an insulating tape 5 while also electrically insulating the joined body defined by connecting the superconducting wires 21a and 21b with each other from that defined by connecting the superconducting wires 31a and 31b with each other similarly through an insulating tape 5, as shown in FIG. 14.

Figure 15:
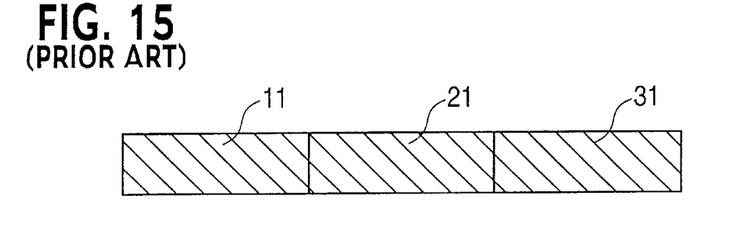
FIG. 15 is a cross sectional view showing another exemplary structure of a superconducting conductor.

FIG. 15 is a cross sectional view showing another exemplary structure of a superconducting conductor.

FIGS. 16 to 21 are cross sectional views showing connection structures for pairs of superconducting conductors A and B each having the structure shown in FIG. 15 respectively.

Figure 16:
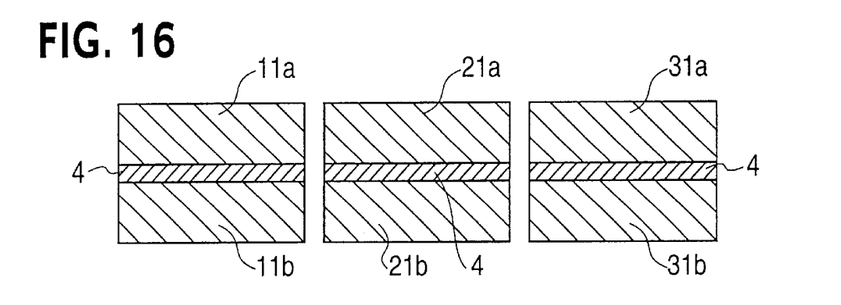
FIGS. 16 to 21 are cross sectional views showing exemplary connection structures according to the present invention for superconducting conductors each having the structure shown in FIG. 15.

In case of connecting two superconducting conductors A and B each having the structure shown in FIG. 15 with each other, a method of joining superconducting wires 11a and 11b of the superconducting conductors A and B respectively with each other through a solder layer 4 so that tape surfaces are superposed with each other while also joining superconducting wires 21a and 21b and 31a and 31b forming the superconducting conductors A and B respectively with each other similarly through solder layers 4 as shown in FIG. 16 is conceivable, for example.

Figure 17:
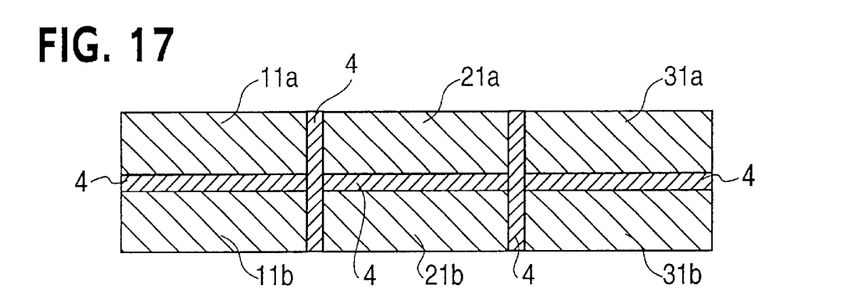

As shown in FIG. 17, a joined body defined by connecting the superconducting wires 11a and 11b with each other may be further joined with that defined by connecting the superconducting wires 21a and 21b with each other through a solder layer 4 while also joining the joined body defined by connecting the superconducting wires 21a and 21b with each other with that defined by connecting the superconducting wires 31a and 31b with each other similarly through a solder layer 4.

Figure 18:
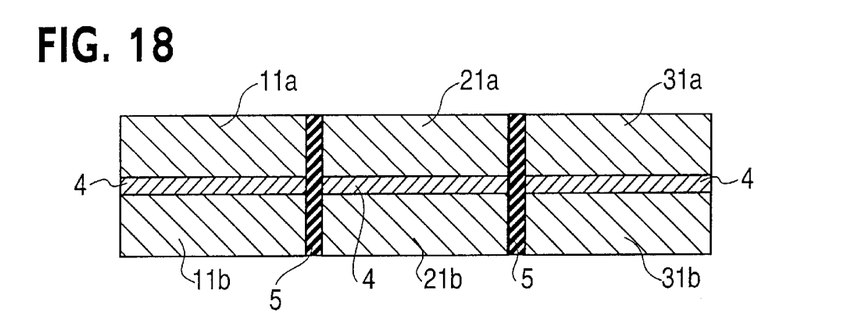
Figure 19:
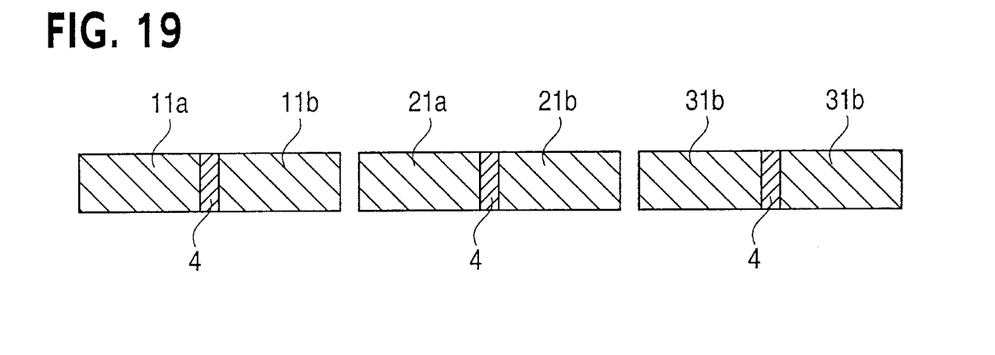

Alternatively, the joined body defined by connecting the superconducting wires 11a and 11b with each other may be electrically insulated from that defined by connecting the superconducting wires 21a and 21b with each other through an insulating tape 5 while also electrically insulating the joined body defined by connecting the superconducting wires 21a and 21b with each other from that defined by connecting the superconducting wires 31a and 31b with each other similarly through an insulating tape 5, as shown in FIG. 18.

In case of connecting two superconducting conductors A and B each having the structure shown in FIG. 15 with each other, on the other hand, a method of joining superconducting wires 11a and 11b of the superconductors A and B respectively with each other through a solder layer 4 so that side surfaces of the tape-like wires 11a and 11b are superposed with each other while also joining superconducting wires 21a and 21b and 31a and 31b of the superconducting conductors A and B respectively with each other similarly through solder layers 4 as shown in FIG. 12 is also conceivable, for example.

Figure 20:
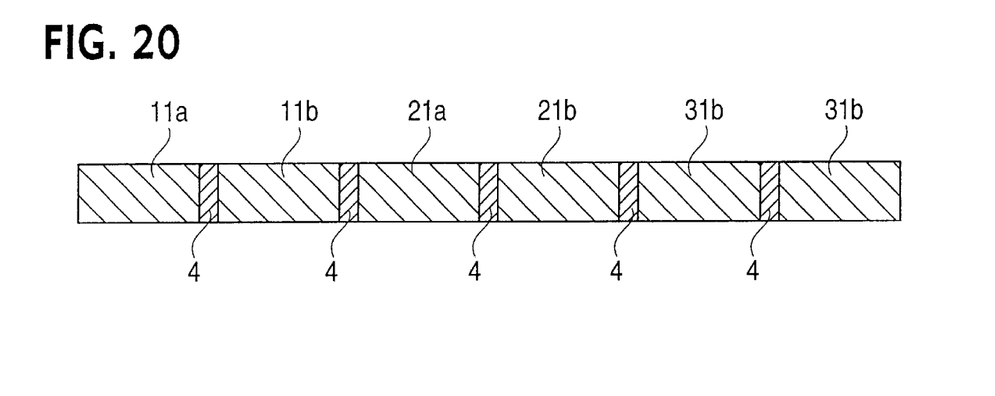

Further, a joined body defined by connecting the superconducting wires 11a and 11b with each other may be further joined with that defined by connecting the superconducting wires 21a and 21b with each other through a solder layer 4 while also joining the joined body defined by connecting the superconducting wires 21a and 21b with each other with that defined by connecting the superconducting wires 31a and 31b with each other similarly through a solder layer 4, as shown in FIG. 20.

Figure 21:
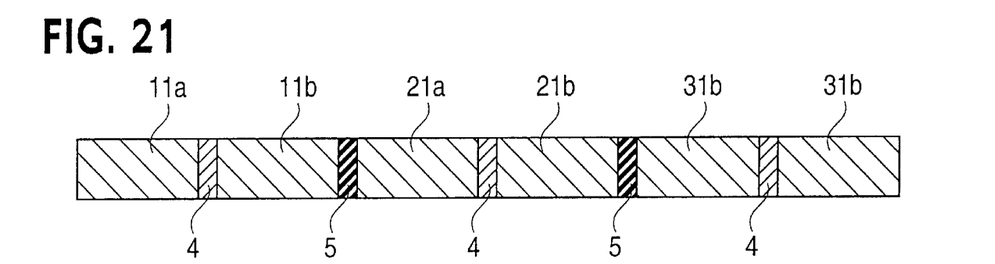

Alternatively, the joined body defined by connecting the superconducting wires 11a and 11b with each other may be electrically insulated from that defined by connecting the superconducting wires 21a and 21b with each other through an insulating tape 5 while also electrically insulating the joined body defined by connecting the superconducting wires 21a and 21b with each other from that defined by connecting the superconducting wires 31a and 31b with each other similarly through an insulating tape 5, as shown in FIG. 21.

Figure 22:
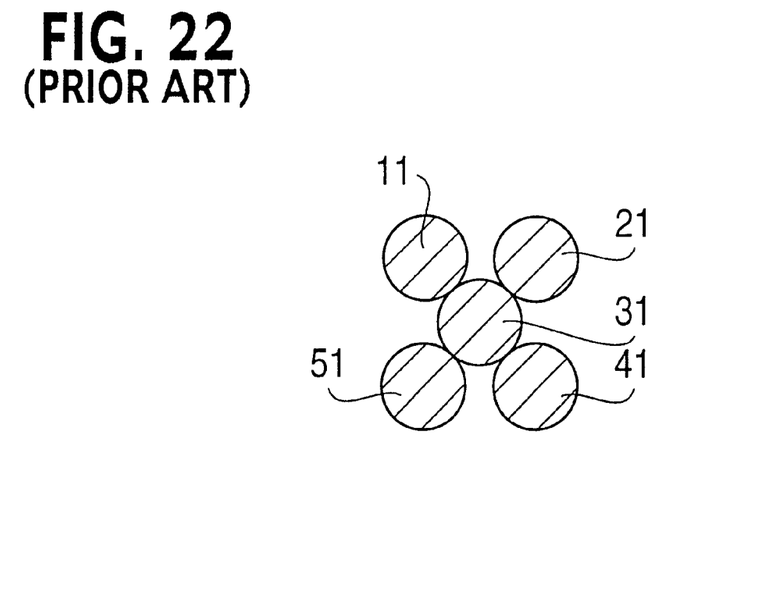
FIG. 22 is a cross sectional view showing still another exemplary structure of a superconducting conductor.

FIG. 22 is a cross sectional view showing still another exemplary structure of a superconducting conductor.

Figure 23:
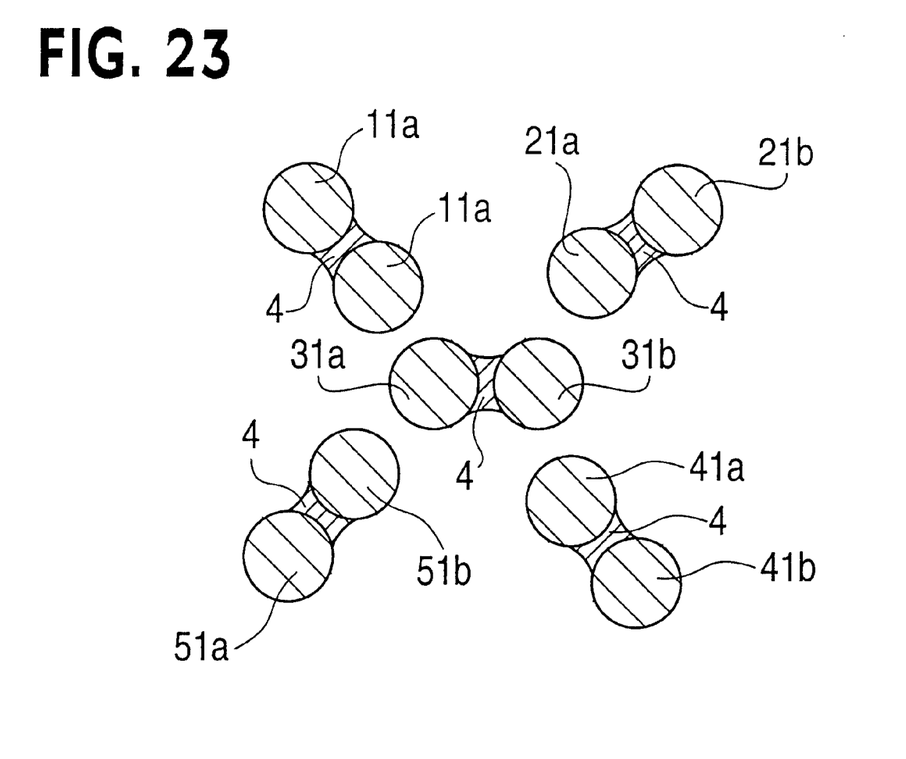
FIGS. 23 to 25 are cross sectional views showing exemplary connection structures according to the present invention for superconducting conductors each having the structure shown in FIG. 22.
Figure 24:
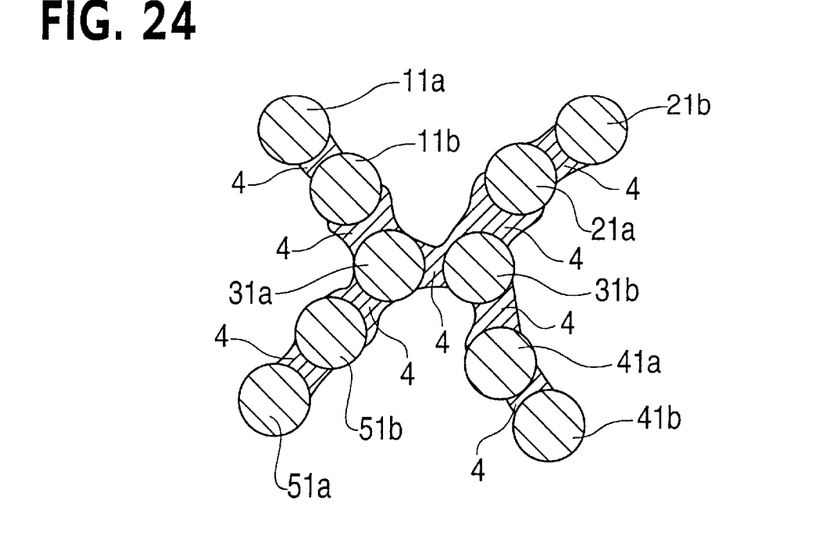
Figure 25:
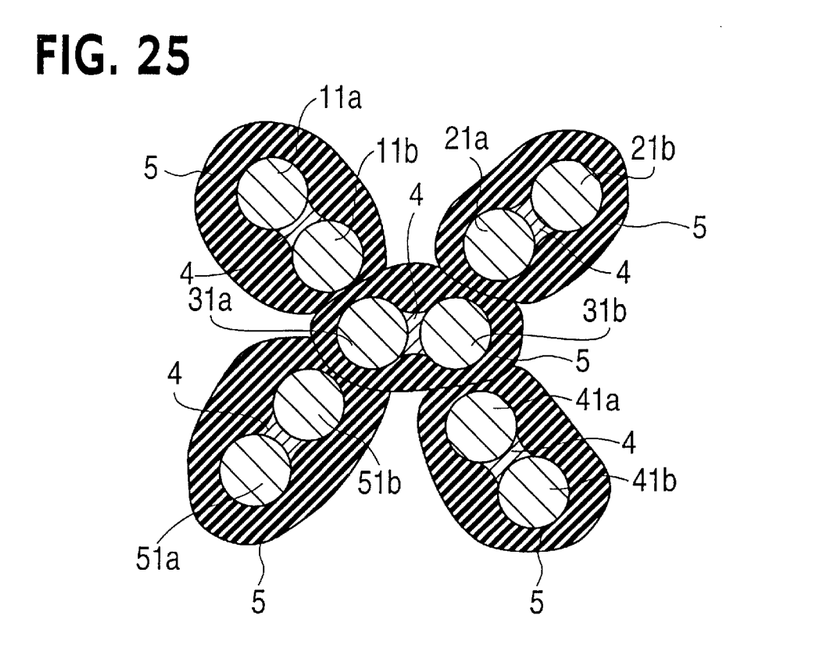

FIGS. 23 to 25 are cross sectional views typically showing connection structures for pairs of superconducting conductors A and B each having the structure shown in FIG. 22 respectively.

In case of connecting two superconducting conductors A and B each having the structure shown in FIG. 22 with each other, a method of joining superconducting wires 11a and 11b of the superconducting conductors A and B respectively with each other thorough a solder layer 4 while also joining superconducting wires 21a and 21b, 31a and 31b, 41a and 41b and 51a and 51b of the superconducting conductors A and B respectively with each other similarly through solder layers 4 as shown in FIG. 23 is conceivable, for example.

As shown in FIG. 24, a joined body defined by connecting the superconducting wires 11a and 11b with each other may be further joined with that defined by connecting the superconducting wires 31a and 31b with each other through a solder layer 4 while also joining joined bodies defined by connecting the superconducting wires 21a and 21b, 41a and 41b and 51a and 51b with each other with that defined by connecting the superconducting wires 31a and 31b with each other similarly through solder layers 4.

Alternatively, an insulating tape 5 may be wound on the joined body defined by connecting the superconducting wires 11a and 11b with each other for insulating this joined body from the remaining ones while also winding insulating tapes 5 on the joined bodies defined by connecting the superconducting wires 31a and 31b, 41a and 41b and 51a and 51b with each other respectively for insulating these joined bodies from each other, as shown in FIG. 25.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connection structure for connecting first and second superconducting conductors, wherein:

portions of first and second superconducting conductors to be connected are divided respectively into at least first and second tape-shaped superconducting wires, each of said at least first and second superconducting wires of said first and second superconducting conductors includes a filament assembly containing superconducting filaments, said first superconducting wire of said first superconducting conductor is aligned widthwise with said first superconducting wire of said second superconducting conductor and joined therewith to form a first joined body such that broad surfaces of the first wire of the first superconducting conductor and of the first wire of the second superconducting conductor are opposed to each other, said second superconducting wire of said first superconducting conductor is aligned widthwise with said second superconducting wire of said second superconducting conductor and joined therewith to form a second joined body such that broad surfaces of the second wire of the first superconducting conductor and of the second wire of the second superconducting conductor are opposed to each other, the broad surfaces of each of the at least first and second superconducting wires of the first and second joined bodies are aligned widthwise, and the first and second joined bodies are joined by a solder layer.

2. The connection structure claimed in claim 1, wherein said superconducting wires are metal coated.

3. The connection structure claimed in claim 2, wherein said metal comprises at least one metal selected from the group consisting of silver, gold, silver alloy and gold alloy.

4. The connection structure claimed in claim 1, wherein said superconducting wires comprise an oxide superconductor.

5. The connection structure claimed in claim 4, wherein said oxide superconductor comprises a bismuth oxide superconductor.

6. A connection structure for connecting first and second superconducting conductors, wherein:

portions of first and second superconducting conductors to be connected are divided respectively into at least first and second tape-shaped superconducting wires, each of said at least first and second superconducting wires of said first and second superconducting conductors includes a filament assembly containing superconducting filaments, said first superconducting wire of said first superconducting conductor is aligned widthwise with said first superconducting wire of said second superconducting conductor and joined therewith to form a first joined body such that broad surfaces of the first wire of the first superconducting conductor and of the first wire of the second superconducting conductor are opposed to each other, said second superconducting wire of said first superconducting conductor is aligned widthwise with said second superconducting wire of said second superconducting conductor and joined therewith to form a second joined body such that broad surfaces of the second wire of the first superconducting conductor and of the second wire of the second superconducting conductor are opposed to each other, the broad surfaces of each of the at least first and second superconducting wires of the first and second joined bodies are aligned widthwise, and the first joined body is insulated from the second joined body.

7. The connection structure claimed in claim 6, wherein said superconducting wires are metal coated.

8. The connection structure claimed in claim 7, wherein said metal comprises at least one metal selected from the group consisting of silver, gold, silver alloy and gold alloy.

9. The connection structure claimed in claim 6, wherein said superconducting wires comprise an oxide superconductor.

10. The connection structure claimed in claim 9, wherein said oxide superconductor comprises a bismuth oxide superconductor.

* * * * *